(12) United States Patent
Fukushima et al.

(10) Patent No.: US 9,970,111 B2
(45) Date of Patent: May 15, 2018

(54) SUBSTRATE PROCESSING APPARATUS HAVING GROUND ELECTRODE

(71) Applicant: TOKYO ELECTRON LIMITED, Tokyo (JP)

(72) Inventors: Kohei Fukushima, Oshu (JP); Hiroyuki Matsuura, Oshu (JP); Yutaka Motoyama, Oshu (JP); Koichi Shimada, Oshu (JP); Takeshi Ando, Oshu (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 399 days.

(21) Appl. No.: 14/312,137

(22) Filed: Jun. 23, 2014

(65) Prior Publication Data

US 2015/0007772 A1    Jan. 8, 2015

(30) Foreign Application Priority Data

Jul. 2, 2013 (JP) .................................. 2013-139101

(51) Int. Cl.
*C23C 16/507* (2006.01)
*H01L 21/02* (2006.01)
(Continued)

(52) U.S. Cl.
CPC .......... *C23C 16/507* (2013.01); *C23C 16/452* (2013.01); *H01J 37/321* (2013.01); *H01J 37/32357* (2013.01); *H01J 37/32779* (2013.01)

(58) Field of Classification Search
CPC ............ C23C 16/45546; C23C 16/505; C23C 16/452; H01J 37/3211; H01J 37/321; H01J 37/32357; H01J 37/32532; H01J 37/32779
See application file for complete search history.

(56) References Cited

U.S. PATENT DOCUMENTS 5,685,942 A  * 11/1997 Ishii .................. H01J 37/32082
                                                                   156/345.48
6,180,019 B1 * 1/2001 Kazumi ............ H01J 37/32009
                                                                   118/723 I (Continued)

FOREIGN PATENT DOCUMENTS

JP    2008-028360 A    2/2008
JP    2009-76876 A     4/2009
(Continued)

*Primary Examiner* — Rakesh K Dhingra
*Assistant Examiner* — Laureen Chan
(74) *Attorney, Agent, or Firm* — Nath, Goldberg & Meyer; Jerald L. Meyer; Annie Kock

(57) ABSTRACT

A substrate processing apparatus includes: a processing vessel configured to be vacuumed; a holding unit configured to hold a plurality of substrates and to be inserted into or separated from the processing vessel; a gas supply unit configured to supply gas into the processing vessel; a plasma generation box partitioned and formed by a plasma partition wall; an inductively coupled electrode located at an outer sidewall of the plasma generation box along its length direction; a high frequency power supply connected to the inductively coupled electrode through a feed line; and a ground electrode located outside the plasma generation box and between the processing vessel and the inductively coupled electrode and arranged in the vicinity of the outer sidewall of the plasma generation box or at least partially in contact with the outer sidewall.

6 Claims, 13 Drawing Sheets

(51) Int. Cl.
*H05H 1/46* (2006.01)
*C23C 16/452* (2006.01)
*H01J 37/32* (2006.01)

(56) References Cited

U.S. PATENT DOCUMENTS

| | | | | |
|---|---|---|---|---|
| 7,795,817 | B2* | 9/2010 | Nitschke | H01J 37/32935 |
| | | | | 315/111.21 |
| 2008/0023653 | A1* | 1/2008 | Lee | H01J 37/321 |
| | | | | 250/492.21 |
| 2009/0056877 | A1* | 3/2009 | Matsuura | C23C 16/345 |
| | | | | 156/345.48 |
| 2010/0186898 | A1* | 7/2010 | Fukushima | C23C 16/345 |
| | | | | 156/345.48 |
| 2012/0228129 | A1* | 9/2012 | Ito | C23C 16/24 |
| | | | | 204/298.02 |

FOREIGN PATENT DOCUMENTS

| | | |
|---|---|---|
| JP | 2010-226084 A | 10/2010 |
| JP | 2011-129703 A | 6/2011 |
| JP | 2011-151081 A | 8/2011 |

\* cited by examiner

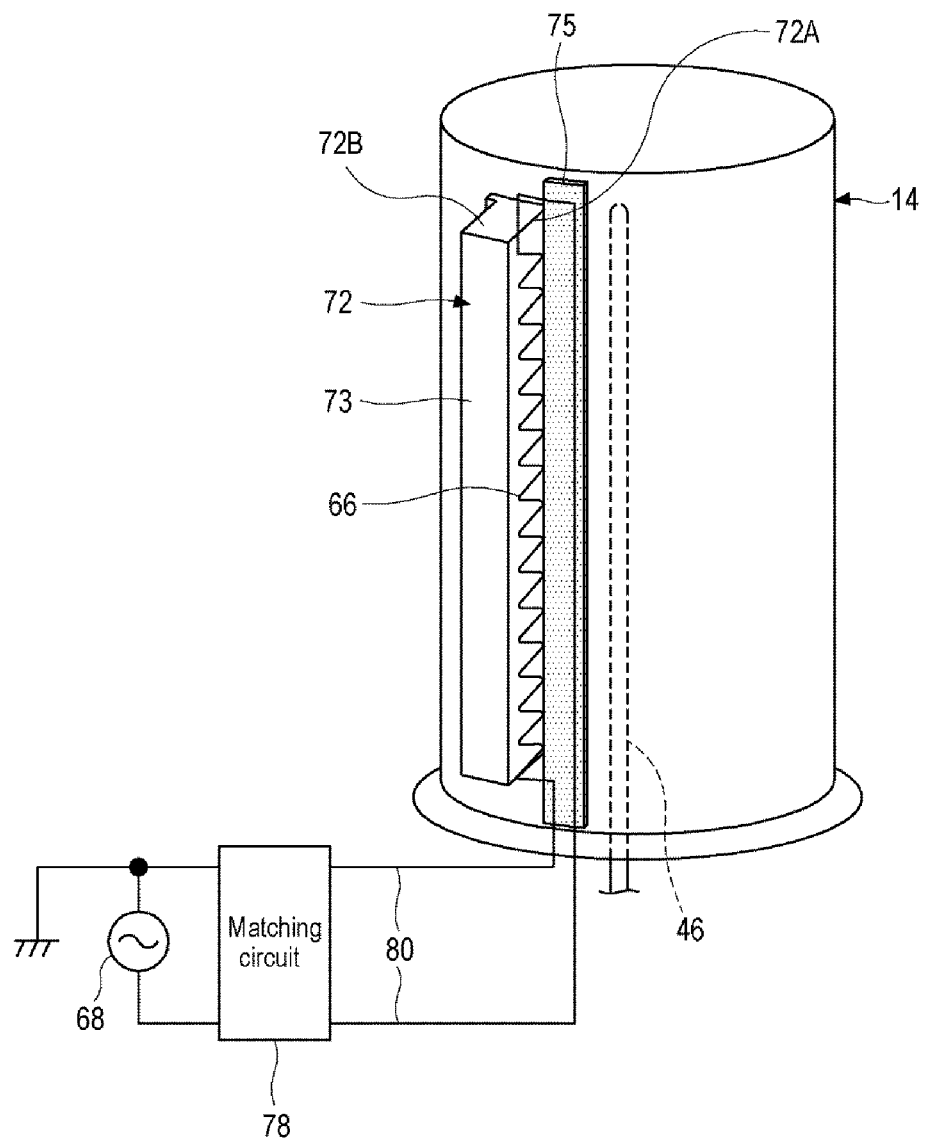

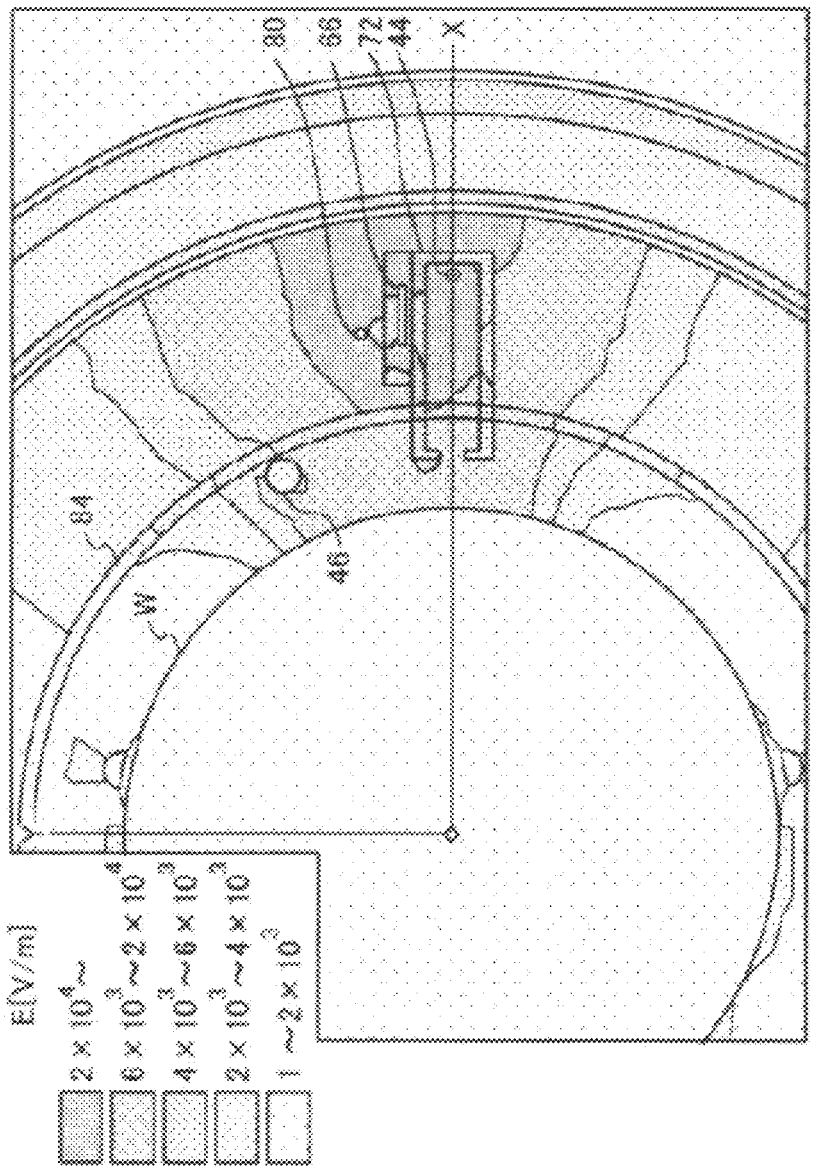

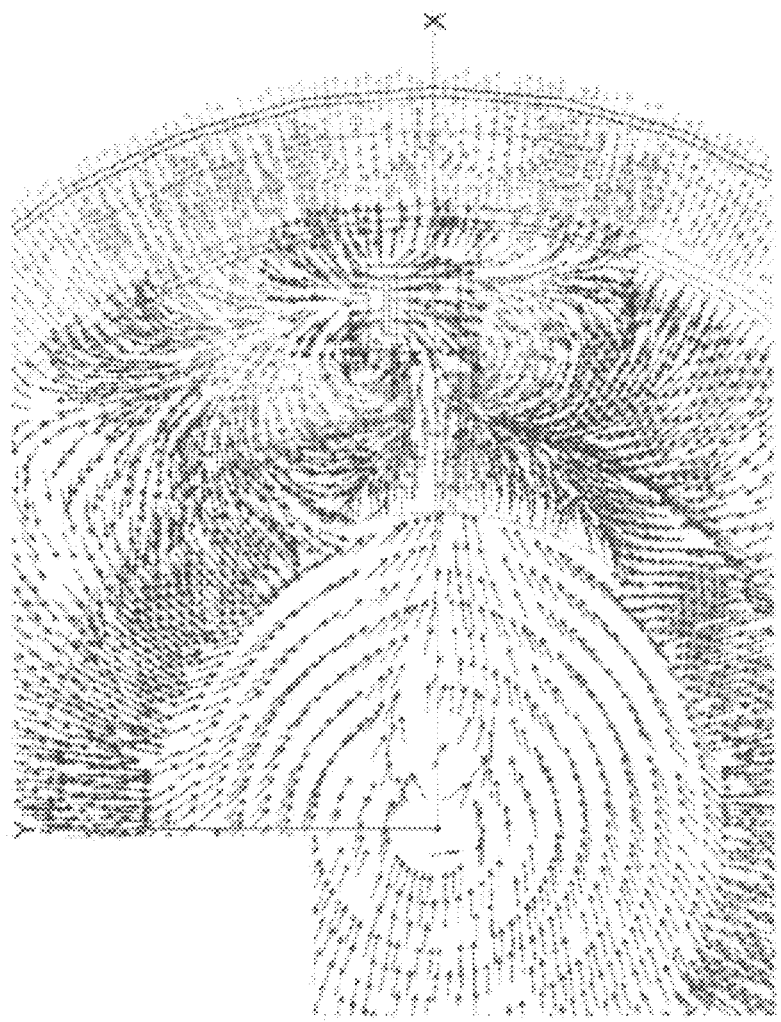

SUBSTRATE PROCESSING APPARATUS HAVING GROUND ELECTRODE

CROSS-REFERENCE TO RELATED APPLICATION

This application claims the benefit of Japanese Patent Application No. 2013-139101, filed on Jul. 2, 2013, in the Japan Patent Office, the disclosure of which is incorporated herein in its entirety by reference.

TECHNICAL FIELD

The present disclosure relates to a substrate processing apparatus.

BACKGROUND

In manufacturing semiconductor devices, semiconductor wafers to be processed (hereinafter, referred to as wafers) are subjected to various processes, such as film formation, oxidation, diffusion, modification, and removal of a native oxidation film. These processes are performed in a vertical type substrate processing apparatus, in which a plurality of wafers generally can be processed in a batch fashion.

Recently, a low temperature is required when a substrate process is performed. Thus, a plasma processing apparatus, in which a variety of processes can be performed even when a wafer temperature is low in the processes, has been proposed. For example, a substrate processing apparatus, in which a plurality of wafers can be plasma-processed in a batch fashion using inductively coupled plasma, has been disclosed.

In such a substrate processing apparatus, since a reaction such as film formation can be facilitated with assistance of plasma, a desired plasma processing can be performed even if a wafer temperature is relatively low.

However, in this substrate processing apparatus, a plasma generating electrode obtains a high voltage when plasma is generated at a high frequency. On this account, an electric field having a high potential difference occurs between the electrode and a wafer. This electric field also generates plasma, which damages the wafer, specifically an edge of the wafer, and thereby generates particles.

SUMMARY

The present disclosure provides a substrate processing apparatus configured to suppress plasma generation in the vicinity of a wafer.

According to one embodiment of the present disclosure, there is provided a substrate processing apparatus including: a processing vessel configured to be vacuumed; a holding unit configured to hold a plurality of substrates and to be inserted into or separated from the processing vessel; a gas supply unit configured to supply gas into the processing vessel; a plasma generation box partitioned and formed by a plasma partition wall, the plasma partition wall being located along a length direction of the processing vessel while protruding toward an outside of the processing vessel; an inductively coupled electrode located at an outer sidewall of the plasma generation box along its length direction; a high frequency power supply connected to the inductively coupled electrode through a feed line; and a ground electrode located outside the plasma generation box and between the processing vessel and the inductively coupled electrode, arranged in the vicinity of the outer sidewall of the plasma generation box or at least partially in contact with the outer sidewall, and extended toward an outside of the plasma generation box.

BRIEF DESCRIPTION OF THE DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

FIG. 3 is a schematic perspective view of the surrounding area of a ground electrode of the substrate processing apparatus of FIG. 1.

FIGS. 6A to 6D are schematic views illustrating an example of effects of the substrate processing apparatus according to the present embodiment.

DETAILED DESCRIPTION

Figure 1:
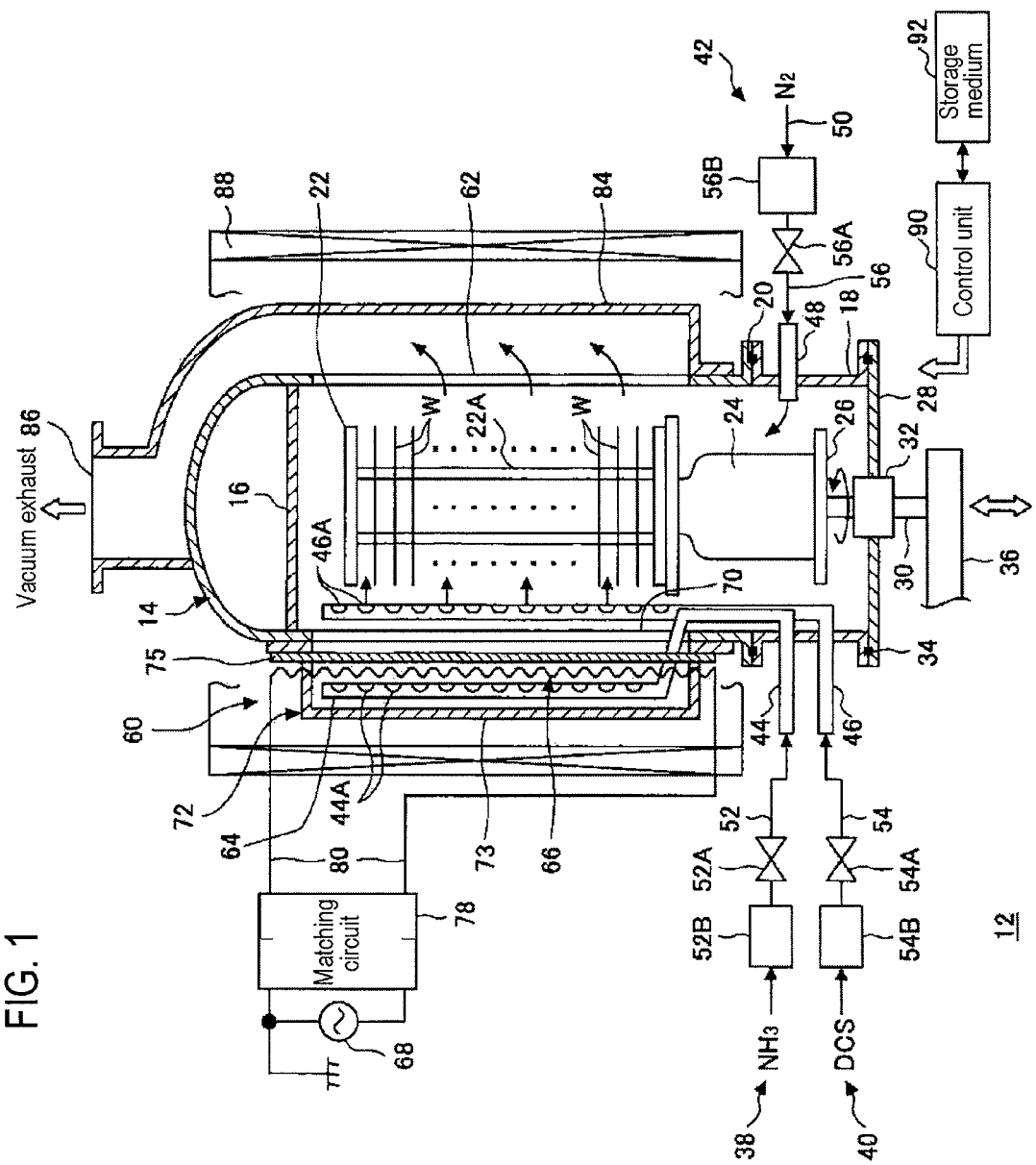
FIG. 1 is a longitudinal sectional view schematically showing a configuration of an example of a substrate processing apparatus according to an embodiment of the present disclosure.

Reference will now be made in detail to various embodiments, examples of which are illustrated in the accompanying drawings. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments. In addition, throughout the specification and drawings, like reference numerals are used to designate substantially like elements and thus redundant descriptions thereof will be omitted.

<Substrate Processing Apparatus>

Figure 2:
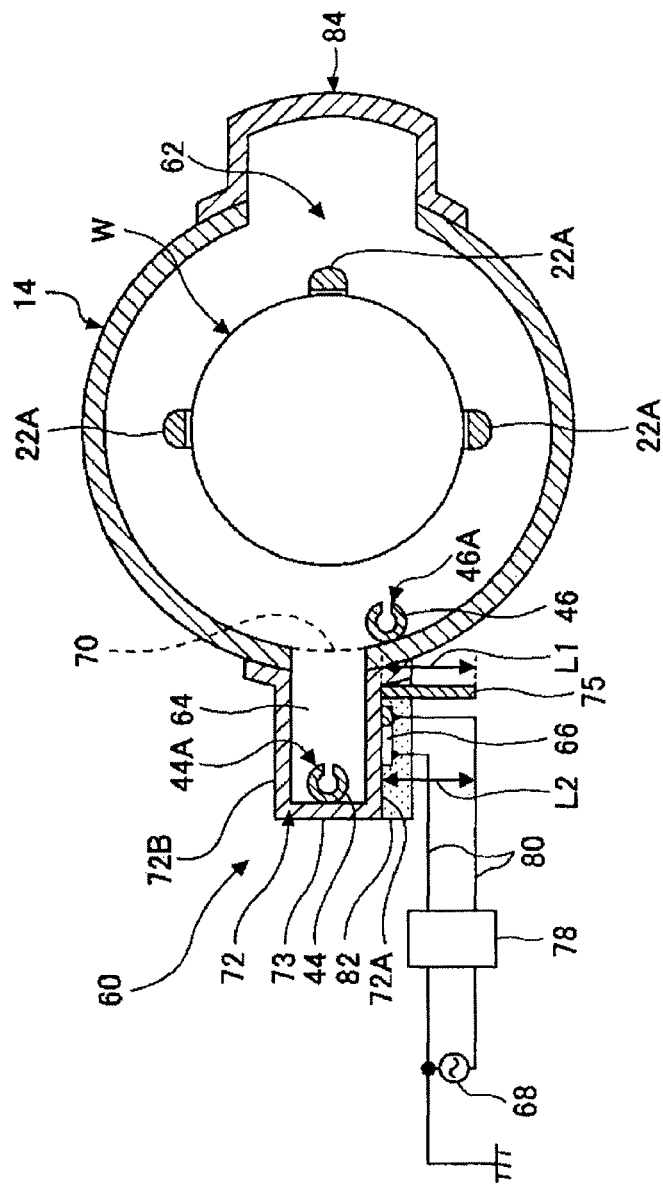
FIG. 2 is a transverse sectional view schematically showing a configuration of the surrounding area of a processing vessel of the substrate processing apparatus of FIG. 1.

FIG. 1 is a longitudinal sectional view schematically showing a configuration of an example of a substrate processing apparatus according to an embodiment of the present disclosure. In addition, FIG. 2 is a transverse sectional view schematically showing a configuration of the surrounding area of a processing vessel of the substrate processing apparatus of FIG. 1. Further, FIG. 3 is a schematic perspective view of the surrounding area of a ground electrode of the substrate processing apparatus of FIG. 1.

As shown in FIG. 1, a substrate processing apparatus 12 includes a cylindrical processing vessel 14 having a ceiling with an open lower end. This processing vessel 14 may be formed, for example, of quartz.

A quartz ceiling plate 16 is installed and sealed at the ceiling of the processing vessel 14. In addition, a manifold 18, which is formed of, for example, stainless steel in the shape of a cylinder, is connected to the opening of the lower end of the processing vessel 14 through a sealing member 20 such as an O-ring. The manifold 18 may also be made of quartz and may be formed integrally with the processing vessel 14.

The lower end of the processing vessel 14 is supported by the manifold 18 and configured such that a wafer boat 22, in which one or a plurality of semiconductor wafers W (hereinafter, referred to as wafers W) are mounted in a multistage manner, can be carried into or out of the processing vessel 14 from the bottom of the manifold 18.

The wafer boat 22 is generally formed of quartz or the like and configured such that 50 to 150 sheets of wafers W having a diameter of 300 mm can be supported at a regular pitch in a multistage manner.

The wafer boat 22 is mounted on a table 26 through a thermal insulation container 24 made of quartz. The table 26 is supported on a rotating shaft 30, which penetrates a lid portion 28 made of, for example, stainless steel and configured to open and close an opening of a lower end of the manifold 18. In addition, the portion penetrated by the rotating shaft 30, for example, is fitted with a magnetic fluid seal 32. The magnetic fluid seal 32 air-tightly seals and rotatably supports the rotating shaft 30. Also, a sealing member 34 such as an O-ring is interposed and installed at a periphery of the lid portion 28 and the lower end of the manifold 18, thereby maintaining the processing vessel 14 to be sealed.

The above-described rotating shaft 30 is installed at a leading end of an arm 36 supported by a lift unit (not shown) and configured such that the wafer boat 22, the lid portion 28 and the like together can be inserted into or separated from the processing vessel 14. In addition, the table 26 may be fixedly installed at the lid portion 28, and the wafers W may be transferred into the processing vessel 14 without rotating the wafer boat 22.

The manifold 18 is provided with a first gas supply unit 38 configured to supply a first processing gas to achieve plasma generation, a second gas supply unit 40 configured to supply a second processing gas, and a third gas supply unit 42 configured to supply an inert gas or the like as a purge gas.

The first gas supply unit 38 has a first gas nozzle 44, which is, for example, made of quartz. The first gas nozzle penetrates a sidewall of the manifold 18 inwards and then is bent and extended upwards. The first gas nozzle 44 has one or a plurality of gas injection holes 44A formed along the height direction of the processing vessel 14 at a predetermined interval. In addition, the first gas nozzle 44 is configured such that the processing gas is approximately uniformly injected from the respective gas injection holes 44A toward the central direction of the processing vessel 14.

In the same manner as the first gas supply unit 38, the second gas supply unit 40 has a second gas nozzle 46, for example, made of quartz, which penetrates the sidewall of the manifold 18 inwards and then is bent and extended upwards. The second gas nozzle 46 has one or a plurality of gas injection holes 46A formed along the height direction of the processing vessel 14 at a predetermined interval. In addition, the second gas nozzle 46 is configured such that the processing gas is approximately uniformly injected from the respective gas injection holes 46A toward the central direction of the processing vessel 14.

The third gas supply unit 42 is formed with a straight line shape penetrating the sidewall of the manifold 18 inwards, and has a third gas nozzle 48 made of, for example, quartz.

Gas lines 52, 54 and 56 are respectively connected to the first, second and third gas nozzles 44, 46 and 48. In addition, opening/closing valves 52A, 54A and 56A and flow rate controllers 52B, 54B and 56B are installed at and interposed with the gas lines 52, 54 and 56, respectively.

<Activation Unit>

Next, an activation unit 60 configured to activate a processing gas by generating plasma and a configuration related thereto, in the substrate processing apparatus 12 according to the present embodiment, will be described in detail.

The activation unit 60 is provided in one side of the above-described processing vessel 14 to activate a processing gas by generating plasma along the height direction of the processing vessel 14. In addition, an exhaust port 62 configured to vacuum and evacuate an internal atmosphere of the processing vessel 14 is formed, for example, at the opposite side of the processing vessel 14 which opposes the activation unit 60. The exhaust port 62 may be formed by cutting off the sidewall of the processing vessel 14.

The activation unit 60 is configured to include a plasma generation box 64 partitioned and formed by a plasma partition wall 72 installed mainly along the height direction (length direction) of the processing vessel 14, an inductively coupled electrode 66 installed at the plasma partition wall 72 along its height direction (length direction) and formed with a winding shape, and a high frequency power supply 68 connected to the inductively coupled electrode 66.

The plasma generation box 64 may be formed in such a manner that an opening 70 is formed by having a predetermined width and being narrow and elongated in the height direction of the processing vessel 14 by cutting off the sidewall of the processing vessel 14 along the height direction of the processing vessel 14, and then, the plasma partition wall 72 formed to cover the opening 70 from the outside thereof is air-tightly welded and bonded to an outer wall of the processing vessel 14.

The plasma partition wall 72 may be formed of, for example, quartz or the like. Without particular limitation, the plasma partition wall 72 may also have, for example, a lying U-shaped cross section, a V-shaped cross section, or a curved line-shaped cross section as viewed from the height direction of the processing vessel 14. Further, in FIGS. 2 and 3, the plasma partition wall 72 has a lying U-shaped cross section as viewed from the height direction.

When the plasma partition wall 72 has a lying U-shaped cross section, the plasma partition wall 72 is formed to have a pair of lateral side walls 72A and 72B oppositely disposed with each other, and a back side wall 73 connecting one side end of the lateral side walls 72A and 72B positioned outside the processing vessel 14 in its diameter direction. In addition, heightwise ends of the lateral side walls 72A and 72B are also closed by partition walls. With this configuration, the interior space of the plasma partition wall 72 may be in communication with the processing vessel 14.

When the plasma partition wall 72 has a lying U-shaped cross section, the inductively coupled electrode 66 may in some embodiments be installed only at one of the pair of lateral side walls 72A and 72B. With this configuration, the area sputtered with ions in plasma becomes correspondingly smaller, so that particle generation by etching can be drastically suppressed.

When the plasma partition wall 72 has a V-shaped cross section, the plasma partition wall 72 may be formed to have a V-shaped cross section by connecting one side ends of a pair of lateral side walls 72A and 72B with each other, without installing the back side wall 73.

When the plasma partition wall 72 has a curved line-shaped cross section, the curved line-shaped cross section may include any curved line, such as a circular arc shape or an elliptical arc shape, etc.

The opening 70 is formed sufficiently long in the vertical direction, such that all the wafers W held and supported in the wafer boat 22 can be covered in the height direction.

If the plasma partition wall 72 has strength sufficient to withstand the atmospheric pressure, the thickness of the plasma partition wall 72 is not specifically limited and may range from, for example, 4.5 to 6.5 mm.

The inductively coupled electrode 66 may be formed of a nickel alloy or the like.

In addition, the inductively coupled electrode 66 is installed to be in contact with or to be spaced apart by a predetermined distance from an outer wall surface of the plasma partition wall 72. In addition, one inductively coupled electrode 66 is installed along the height direction of the outer wall surface and is formed in an approximately half turned coil with respect to the plasma generation box 64. In addition, the inductively coupled electrode 66 is folded back outwards to be spaced apart from the plasma partition wall 72 at an upper end of the outer wall surface.

When the inductively coupled electrode 66 is installed to be spaced apart from the outer wall surface of the plasma partition wall 72 by a predetermined distance, the strength of a capacitive electromagnetic field in the plasma generation box 64 can be reduced corresponding to the spaced portion. Although a standing wave is generated in the plasma generation box 64 by the input high frequency, the standing wave may be non-uniformly generated in some cases. As a result, the strength of the electromagnetic field may be generally increased, or the strength of the electromagnetic field may be locally increased more than the other portions. Thus, an inner surface of the plasma partition wall is sputtered with ions accelerated at those portions, which, in some cases, may be a cause of particles or metal contamination by components of the plasma partition wall. On this account, at least a portion of the inductively coupled electrode 66 may be disposed to be spaced apart by a predetermined distance from the outer wall surface of the plasma partition wall 72.

When the inductively coupled electrode 66 and the outer wall surface of the plasma partition wall 72 are spaced apart from each other, the spaced distance is in some embodiments in the range of 0.5 mm to 20 mm. If the spaced distance is less than 0.5 mm, the reduction effect of electromagnetic field strength in the plasma generation box 64 is insufficient, so that, in some cases, the sputtering of the inner wall surface may not be sufficiently suppressed. If the spaced distance is larger than 20 mm, the electromagnetic field strength in the plasma generation box 64 is excessively lowered, which, in some cases, may have a negative influence on film forming amount and uniformity.

The inductively coupled electrode 66 may be either straightly or windingly extended in the height direction of the plasma generation box 64. By making the inductively coupled electrode 66 winding, the area and length of electrode installation may be increased with respect to the plasma generation box 64. With this configuration, the amount of radicals generated by the activation of the processing gas may be increased. Thus, plasma processing efficiency can be increased, thereby improving throughput.

When the inductively coupled electrode 66 is made to be winding, as shown in FIGS. 4A to 4E, a plurality of bents 74 are alternately connected to each other in left and right reverse directions to be in a meandering shape. Although not limited, each bent 74 may be formed in the shape of a semicircular arc. In addition, the semicircular arc-shaped bents 74 may be alternately connected to each other in reverse directions to be formed in an S shape having a generally meandering shape.

As described above, the shape of the bents 74 is not limited to the semicircular arc. FIGS. 4A to 4E show schematic views illustrating examples of a shape of the inductively coupled electrode 66 of the present embodiment. In an example shown in FIG. 4A, each bent 74 of the inductively coupled electrode 66 is formed in the shape of an elliptical arc, and the bents 74 are alternately connected to each other in reverse directions to be in a generally meandering shape. In an embodiment similar to that of FIG. 4A, the winding shape of the inductively coupled electrode 66 may include, for example, a cycloid curve, a sine curve, or the like.

Figure 4A:
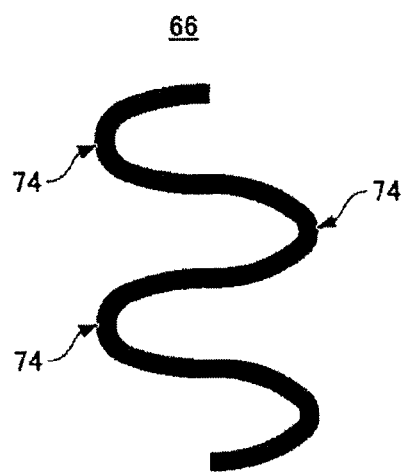
FIGS. 4A to 4E are schematic views illustrating examples of a shape of an inductively coupled electrode of the substrate processing apparatus according to the present embodiment.
Figure 4B:
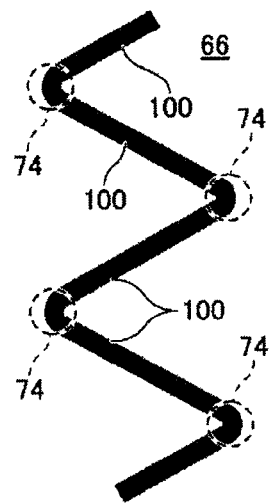

In an example shown in FIG. 4B, the inductively coupled electrode 66 has the bents 74 and straight portions 100 each having a predetermined length. In addition, the bents 74 and the straight portions 100 are alternately connected to each other to be in the shape of a zigzag or the shape of a winding mountain path. In this case, the bent 74 is formed, for example, in the shape of a fine circular arc.

Figure 4C:
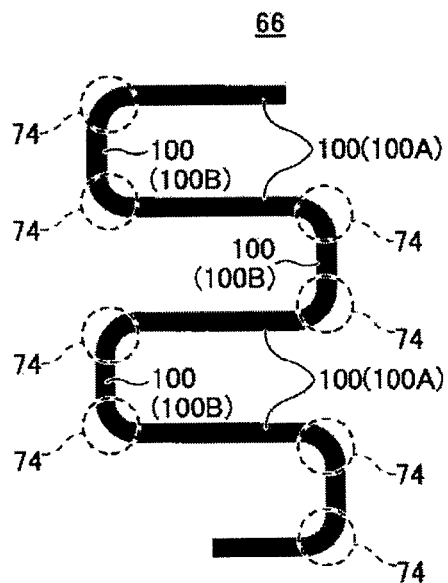

In an example shown in FIG. 4C, the winding inductively coupled electrode 66 has the bents 74 and the straight portions 100 each having a predetermined length, in the same manner as the embodiment of FIG. 4B. In an example shown in FIG. 4C, the bents 74 and the straight portions 100 are alternately connected to each other to be in the shape of a crank. In addition, although the straight portions 100 have long straight portions 100A and short straight portions 100B alternately used, the straight portions having the same length may be used.

Figure 4D:
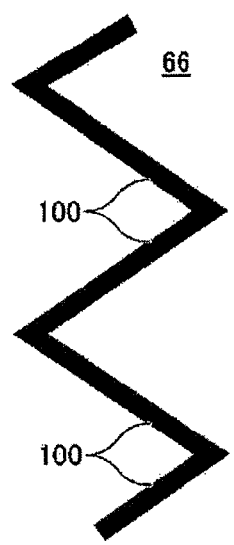

In an example shown in FIG. 4D, the inductively coupled electrode 66 is formed in the shape of a zigzag or a winding mountain path, by alternately connecting the straight portions 100 with each other at a predetermined angle, each straight portion 100 having a predetermined length.

Figure 4E:
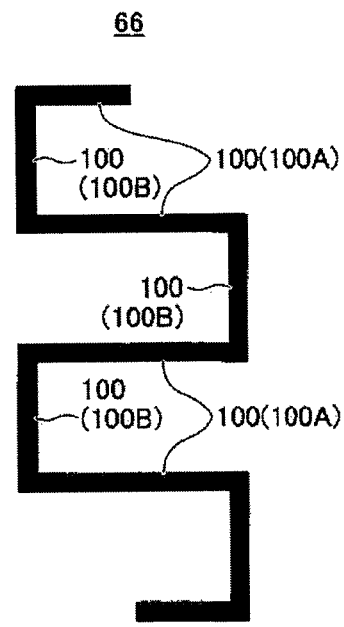

In an example shown in FIG. 4E, the straight portions 100A and 100B are alternately connected to each other, for example, at a right angle, to be in the shape of a crank. Even in this case, the straight portions 100A and 100B may have the same length or different lengths.

For safety, an insulating plate 82 including quartz or the like, for example, is provided on a surface of the inductively coupled electrode 66. In addition, a proximal end side of the inductively coupled electrode 66 is connected to the high frequency power supply 68 through a feed line 80. In the middle of the feed line 80, a matching circuit 78 configured to facilitate impedance matching is installed, as shown in FIG. 3. Also, an adjustment signal (not shown) is sent in-between the matching circuit 78 and the high frequency power supply 68 such that impedance is adjusted automatically.

Further, one end side of the inductively coupled electrode 66, for example, a lower end side of the inductively coupled electrode 66 is grounded.

Even though 13.56 MHz is generally used as a frequency of the high frequency power supply 68, the present disclosure is not limited thereto, and a frequency ranging from 4 to 27.12 MHz may be used.

With the above-described configuration, an electromagnetic field generated by high frequency power supplied to the inductively coupled electrode 66 generates plasma within the plasma generation box 64. In addition, for example, the plasma generation box 64 has a height of 1 m or so, a protruding length from the processing vessel 14 of 50 to 120 mm or so, and a width of 20 to 50 mm or so. Further, in such a case, the area in which the inductively coupled electrode 66 is formed has a width of 2 to 10 mm or so.

In addition, although in the example shown in FIGS. 1 to 3, the substrate processing apparatus 12 is configured to have the single plasma generation box 64 as the activation unit 60, the present disclosure is not limited thereto, and the substrate processing apparatus 12 may be configured to have a plurality, for example, two plasma generation boxes. The configuration having a plurality of plasma generation boxes makes it possible to increase the generation amount of radicals.

Figure 5A:
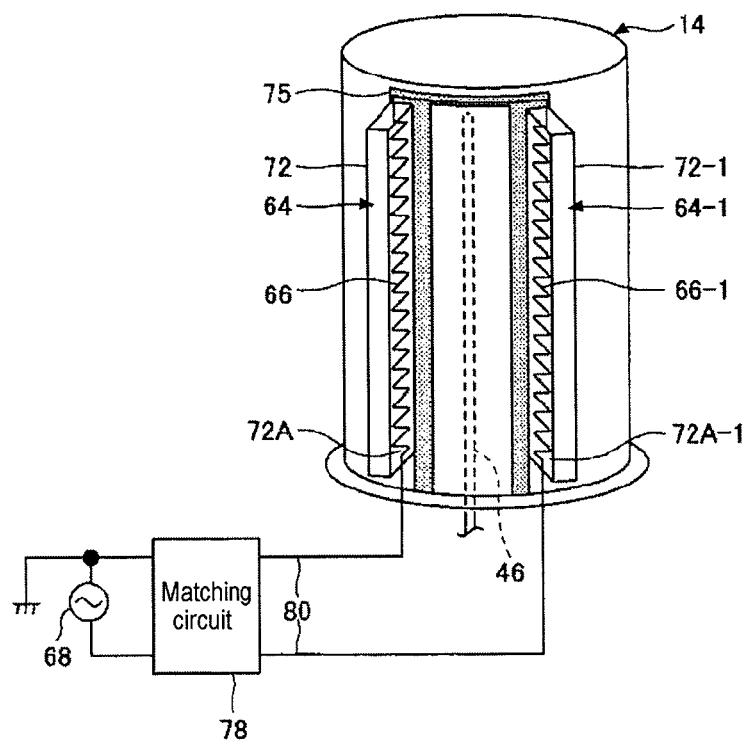
FIGS. 5A and 5B are respectively a schematic perspective view and a schematic partial transverse sectional view of another example of the substrate processing apparatus according to the present embodiment.

FIG. 5A shows a schematic perspective view of another example of the substrate processing apparatus according to the present embodiment. As shown in FIG. 5A, a second plasma generation box 64-1 is provided on the sidewall of the processing vessel 14 to be parallel with the above-described plasma generation box 64.

The second plasma generation box 64-1 may have the same configuration as the above-described plasma generation box 64. For example, the second plasma generation box 64-1 may be configured to have a plasma partition wall 72-1, which has a lying U-shaped cross section and has lateral side walls 72A-1 and 72B-1 and a back side wall 82-1. Hereinafter, the second plasma generation box 64-1 having a lying U-shaped cross section will be described, but the present disclosure is not limited thereto.

Also, the second plasma generation box 64-1 is provided therein with a first gas nozzle 44-1 having the same configuration as the first gas nozzle 44. In addition, the second plasma generation box 64-1 is configured such that the processing gas may be injected from gas injection holes 44A-1 while a flow rate of the processing gas is controlled in the same manner as above. In addition, the first gas nozzle 44-1 may be installed by branching from the first gas nozzle 44 or may be newly installed separately and independently, for example.

Figure 5B:
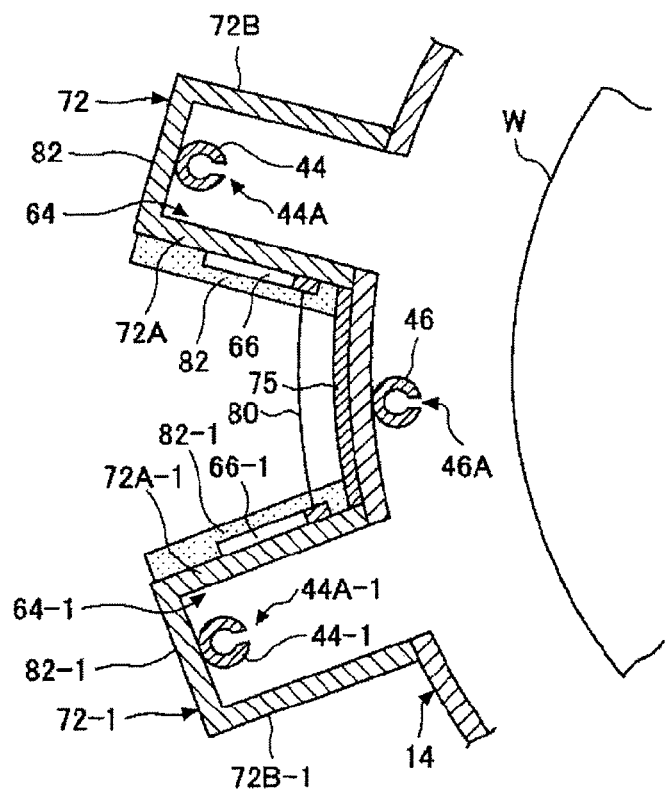

In the example shown in FIG. 5A, the first and second plasma generation boxes 64 and 64-1 are installed such that the lateral side wall 72A of the first plasma generation box 64 and the lateral side wall 72A-1 of the second plasma generation box 64-1 are opposite to each other. In addition, as shown in a schematic longitudinal and transverse sectional views of FIG. 5B, the second gas nozzle 46 is disposed in the processing vessel 14 between both the plasma generation boxes 64 and 64-1. The exhaust port 62 is provided opposite to the second gas nozzle 46 with respect to the central axis of the vessel.

In addition, the inductively coupled electrodes 66 and 66-1 are respectively installed to both the plasma generation boxes 64 and 64-1. The inductively coupled electrode 66 and the inductively coupled electrode 66-1 are serially connected to each other between both the plasma generation boxes 64 and 64-1. That is, the present embodiment is configured such that the new inductively coupled electrode 66-1 is installed in the middle of the feed line 80 of the circuit of the high frequency power supply 68 shown in FIG. 2.

The inductively coupled electrode 66-1 is installed at the lateral side wall 72A-1 opposite the lateral side wall 72A of the plasma generation box 64, along the length direction of the lateral side wall 72A-1. However, the inductively coupled electrode 66-1 may be configured to be installed at the other lateral side wall 72B-1.

When the two plasma generation boxes 64 and 64-1 are installed, since radicals (active species) of the processing gas are generated in the respective plasma generation boxes 64 and 64-1, a larger amount of radicals is generated. In the processing vessel 14, the generation amount of radicals is generally increased, and so a radical density is also increased. Thus, the reaction is accelerated, thereby resulting in improved throughput.

In addition, while it has been described here that the two plasma generation boxes 64 and 64-1 are installed, three or more plasma generation boxes may be installed.

The substrate processing apparatus 12 of the present embodiment includes the inductively coupled electrode 66 having a winding shape. On this account, in terms of the plasma generated by the electromagnetic field due to the inductively coupled electrode 66, a potential difference of ion sheath becomes smaller, thereby decreasing the acceleration of ions in the plasma. This can prevent the inner surface of the plasma partition wall 72 from being etched by ion sputtering. Accordingly, particle generation, which is a cause of throughput decrease in semiconductor devices, can be suppressed.

In addition, since the inductively coupled electrode 66 may be used to improve radical density without increasing high frequency power or frequency, it is possible to perform plasma processing efficiently. That is, since a large amount of power can be input, it is possible to suppress particle generation and increase electron density, thereby resulting in improved plasma processing efficiency.

As shown in FIG. 1, the first gas nozzle 44, which is formed to be extended in the height direction within the processing vessel 14, is bent in the middle thereof and outward in the diameter direction of the processing vessel 14. Then, the first gas nozzle 44 is positioned at a space in the plasma partition wall 72 which is spaced apart from the center of the processing vessel 14. In addition, when the high frequency power supply 68 is turned on, the processing gas injected from the gas injection holes 44A of the first gas nozzle 44 is activated into active species such as radicals in the plasma generation box 64. Then, the processing gas is diffused and flows toward the center of the processing vessel 14.

In some embodiments, an insulating protective cover (not shown), for example, formed of quartz or the like, may be installed outside the plasma partition wall 72 to cover the plasma partition wall 72. In addition, a coolant path (not shown) is provided inside the insulating protective cover. In these instances, the inductively coupled electrode 66 may be cooled by flowing cooled nitrogen gas through the coolant path.

The second gas nozzle 46 is installed inside the processing vessel 14 and in the vicinity of the opening 70 of the plasma partition wall 72. The second gas nozzle 46 is configured so that the processing gas can be injected in the central direction of the processing vessel 14 through the gas injection holes 46A formed at the second gas nozzle 46.

An exhaust port covering member 84, which is formed of quartz with a lying U-shaped cross section, is installed by welding at the exhaust port 62 and covers the exhaust port 62 formed opposite the opening 70 of the processing vessel 14. The exhaust port covering member 84 is extended along the sidewall of the processing vessel 14 in its height direction. In addition, the exhaust port covering member 84 is vacuumed by a vacuum exhaust system. The vacuum exhaust system is installed in an upper direction of the processing vessel 14 and connected to a gas outlet 86 through a vacuum pump or the like (not shown). In addition, a cylindrical heating unit 88 is installed to surround an outer periphery of the processing vessel 14 and heating the processing vessel 14 and the wafer W in the processing vessel 14.

<Ground Electrode>

A ground electrode 75 according to the present embodiment will be described in detail.

The inductively coupled electrode 66 for plasma generation obtains a high voltage when generating plasma at a high frequency using the substrate processing apparatus 12 of the present embodiment. On this account, an electric field having a high potential difference occurs between the inductively coupled electrode 66 and the wafer W, and, in some cases, this electric field may generate plasma. In this case, the generated plasma activates the processing gas in the processing vessel 14, and thus, the generated ions etch an edge of the wafer or the like, thereby generating particles.

On this account, in the present embodiment, in order to maintain high density plasma in the plasma generation box 64 and suppress plasma generation in the vicinity of the wafer, the ground electrode 75, which is grounded, is arranged. The arrangement of the ground electrode 75 can relieve a strong direct electric field between the inductively coupled electrode 66 and the wafer.

The ground electrode 75 is not specifically limited if it is formed of a material having high heat and corrosion resistance, and may be formed, for example, of a nickel alloy such as Inconel®.

The ground electrode 75 is arranged outside the plasma generation box 64 and installed at a space between the processing vessel 14 and the inductively coupled electrode 66 installed outside the processing vessel 14.

In addition, the ground electrode 75 is installed to be in contact with at least a portion of the outer sidewall of the plasma generation box 64 in this space and extended toward the outside of the plasma generation box 64.

Further, the length of the ground electrode 75 in the height direction of the plasma generation box 64 is designed to correspond to the area in which the inductively coupled electrode 66 is formed or to be longer than the aforementioned area.

The length of the ground electrode 75 extending from the outer sidewall of the plasma generation box 64 is in some embodiments designed corresponding to the length of the inductively coupled electrode 66 and the feed line 80, which extend from the outer sidewall of the plasma generation box 64. For example, when the plasma generation box 64 has a lying U-shaped cross section and the inductively coupled electrode 66 is provided at the lateral side wall 72A, the length L1 of the ground electrode 75 extending from the outer sidewall of the plasma generation box 64, as shown in FIG. 2, is in some embodiments equal to or greater than the length L2 of the inductively coupled electrode 66 and the feed line 80 extending from the outer sidewall of the plasma generation box 64, i.e., L1≥L2.

In addition, when a plurality of plasma generation boxes 64 are being installed and the inductively coupled electrodes 66 are arranged at the respective plasma generation boxes 64, the ground electrode 75 is in some embodiments arranged at a space between the feed line 80 and the processing vessel 14, corresponding to the feed line 80 connected to the respective inductively coupled electrodes 66. That is, corresponding to the inductively coupled electrode 66 and the feed line 80 in the vicinity of the processing vessel 14, the ground electrode 75 is arranged at a space between the inductively coupled electrode 66 and feed line 80 and the processing vessel 14.

Further, the overall operation of the substrate processing apparatus 12, such as starting and stopping supply of a variety of gases, power setting of the high frequency power supply 68, turning on/off the high frequency power supply 68, setting of a process temperature or a process pressure, or the like, is controlled by a control unit 90. The control unit 90 includes, for example, a computer or the like. In addition, the control unit 90 has a storage medium 92, such as a flexible disc, a CD (Compact Disc), a hard disc, a flash memory, or a DVD, configured to store a computer-readable program for controlling the operation of the substrate processing apparatus 12.

<Substrate Processing Method>

Now, an example of a substrate processing method using the above-described substrate processing apparatus 12 will be described. In addition, a case in which a silicon nitride film (SiN) is formed on a wafer W by a plasma ALD film forming process using the substrate processing apparatus 12 will be described as an example in the present embodiment. In this case, ammonia gas is used as the first processing gas to be activated with plasma, and a silane-based gas is used as the second processing gas. In addition, a SiN film is formed on the wafer W by activating the ammonia gas with plasma while alternately supplying the silane-based gas and the ammonia gas. However, the substrate processing method using the substrate processing apparatus 12 of the present embodiment is not limited thereto. The film to be formed may be different from the SiN film. Though the plasma ALD film forming process has been described as an example, the above-described substrate processing method may be applied to other substrate processes using plasma, such as, plasma CVD, plasma modification, plasma oxidation diffusion, plasma sputtering, plasma nitration, etc.

First, the wafer boat 22 mounted with, for example, 50 to 150 sheets of wafers W is loaded in the processing vessel 14 by raising the wafer boat 22 from under the processing vessel 14. In addition, the processing vessel 14 has a predetermined temperature set in advance. Then, as the lid portion 28 closes the opening of the lower end of the manifold 18, the processing vessel 14 is sealed.

Thereafter, the interior of the processing vessel 14 is vacuumed to maintain a predetermined process pressure and increase power supplied to the heating unit 88. Thus, wafer temperature is increased to maintain a process temperature. Then, the silane-based gas and the ammonia gas are alternately and intermittently supplied from the second gas supply unit 40 and the first gas supply unit 38, respectively. Here, plasma is generated in the plasma generation box 64 of the activation unit 60, by turning on the high frequency power supply 68 during at least a part of the total supply time of the ammonia gas. Accordingly, the SiN film is formed on the surfaces of the wafers W supported by the rotating wafer boat 22.

More specifically, the ammonia gas is horizontally injected from the gas injection holes 44A of the first gas nozzle 44. In addition, the silane-based gas is horizontally injected from the gas injection holes 46A of the second gas nozzle 46. Then, these gases react with each other on the surfaces of the wafers W to form the SiN film. In this case, the respective gases are supplied not continuously but at the same time or at different times. In addition, the gases at different timings are alternately, intermittently and repeatedly supplied with an intermittence period (purge period), repeatedly stacking a thin film of the SiN film on one another. In addition, the high frequency power supply 68 is turned on to generate plasma when the ammonia gas flows. Then, the supplied ammonia gas is activated to create active species and the like, which promotes the reaction (decomposition). The output power of the high frequency power supply 68 at this time may range, for example, from 50 W to 3 kW.

<First Embodiment>

Embodiments, in which it was confirmed that the electric field strength in the vicinity of the wafer can be reduced by the substrate processing apparatus according to the present embodiment, will be described.

Figure 6A:
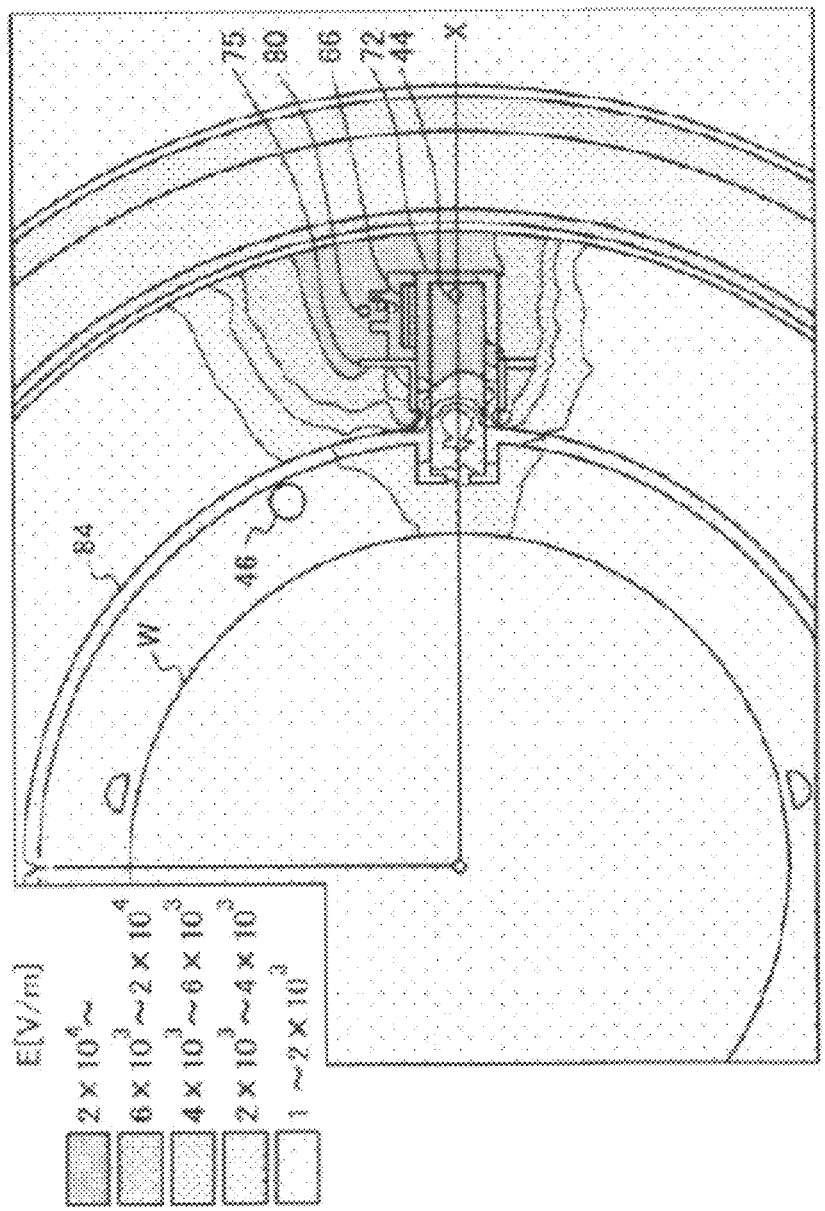
Figure 6D:
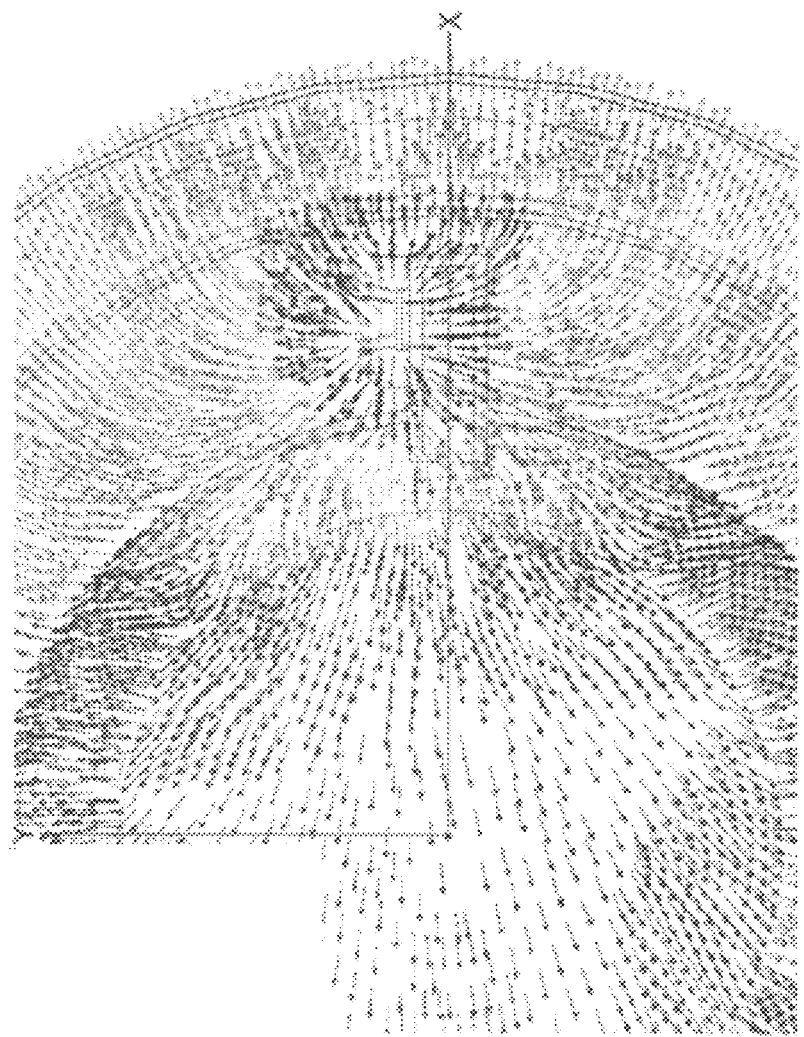

FIGS. 6A to 6D are schematic views illustrating an example of effects of the substrate processing apparatus of the present embodiment. FIG. 6A shows a simulation result of the electric field strength in the substrate processing apparatus, when predetermined output power is input from the high frequency power supply 68 in the substrate processing apparatus according to the present embodiment shown in FIGS. 1 to 3. FIG. 6B, as a comparative embodiment, shows a simulation result of the electric field strength in the substrate processing apparatus when the ground electrode 75 is not included. Further, FIG. 6C shows a simulation result of electric field vector directions in FIG. 6A. In addition, FIG. 6D shows a simulation result of electric field vector directions in FIG. 6B. Furthermore, in FIGS. 6C and 6D and FIGS. 7A to 7D described later, although reference symbols are not assigned, x and y axes are assigned at the same position in FIGS. 6A and 6B, for the reference of positional relationships.

It becomes clear from a comparison of FIGS. 6A and 6B that a relatively strong electric field is generated in a peripheral portion of the wafer in the comparative embodiment, while a lower electric field is generated in a peripheral portion of the wafer in the substrate processing apparatus of the present embodiment. In this regard, as the ground electrode 75 is arranged at the substrate processing apparatus according to the present embodiment, it can be seen that the electric field strength in the vicinity of the wafer, particularly, in the peripheral portion of the wafer, can be reduced.

In addition, the electric field strength caused by the inductively coupled electrode 66 generally depends on a distance from the inductively coupled electrode 66. Here, from a comparison of FIGS. 6C and 6D, as the ground electrode 75 is arranged at the substrate processing apparatus 12 of the present embodiment, the electric field vector directions are in the shape of a vortex centered on the ground electrode 75. Accordingly, it is understood that the substantive distance between the inductively coupled electrode 66 and the wafer is increased, and thus, the electric field strength in the peripheral portion of the wafer becomes reduced.

Figure 7A:
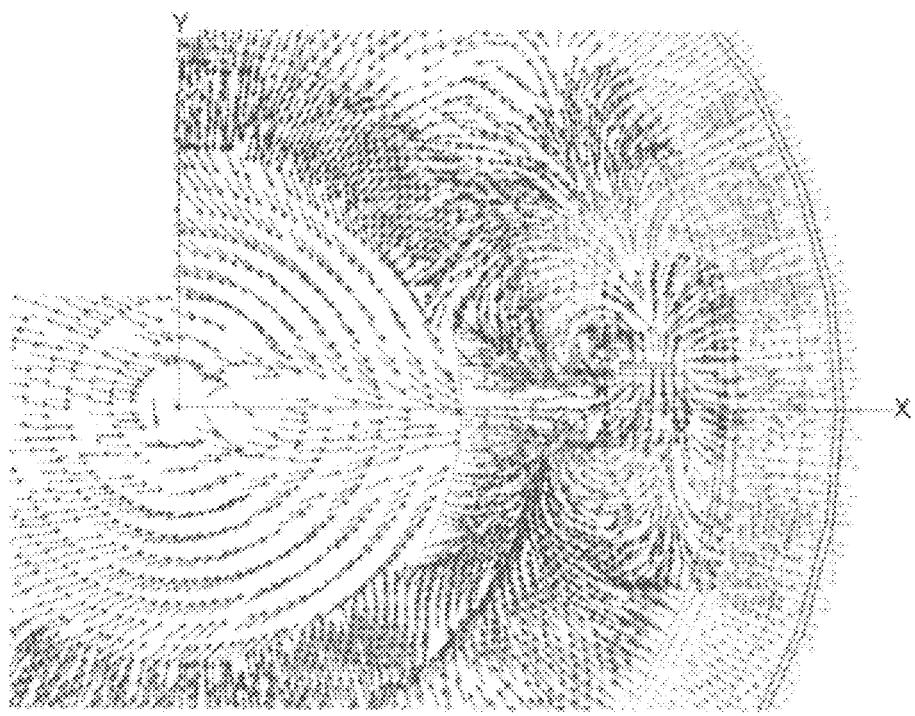
FIGS. 7A to 7D are schematic views illustrating another example of effects of the substrate processing apparatus according to the present embodiment.
Figure 7B:
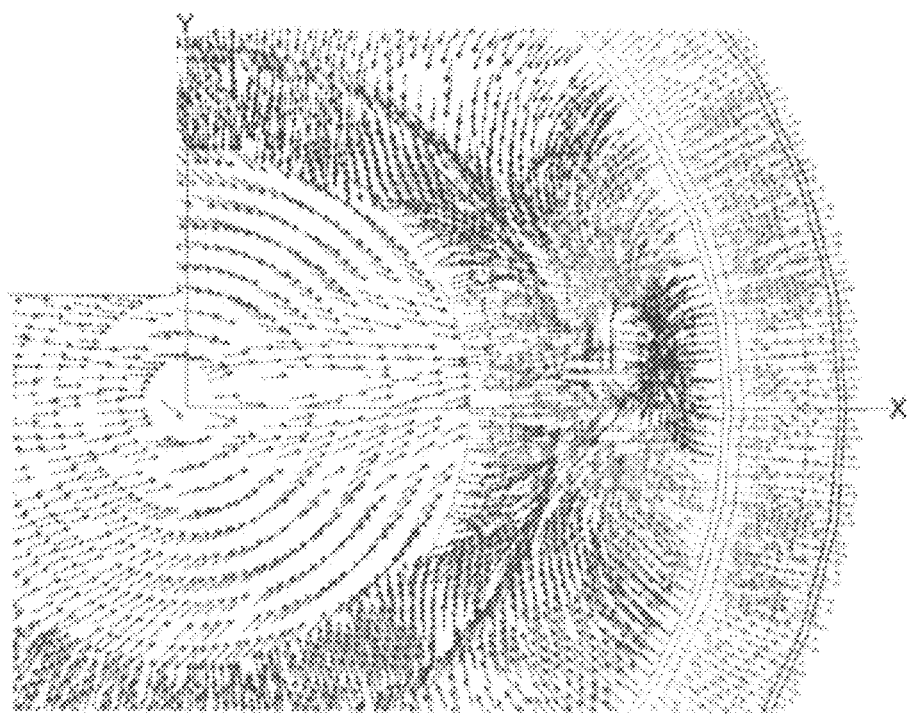
Figure 7C:
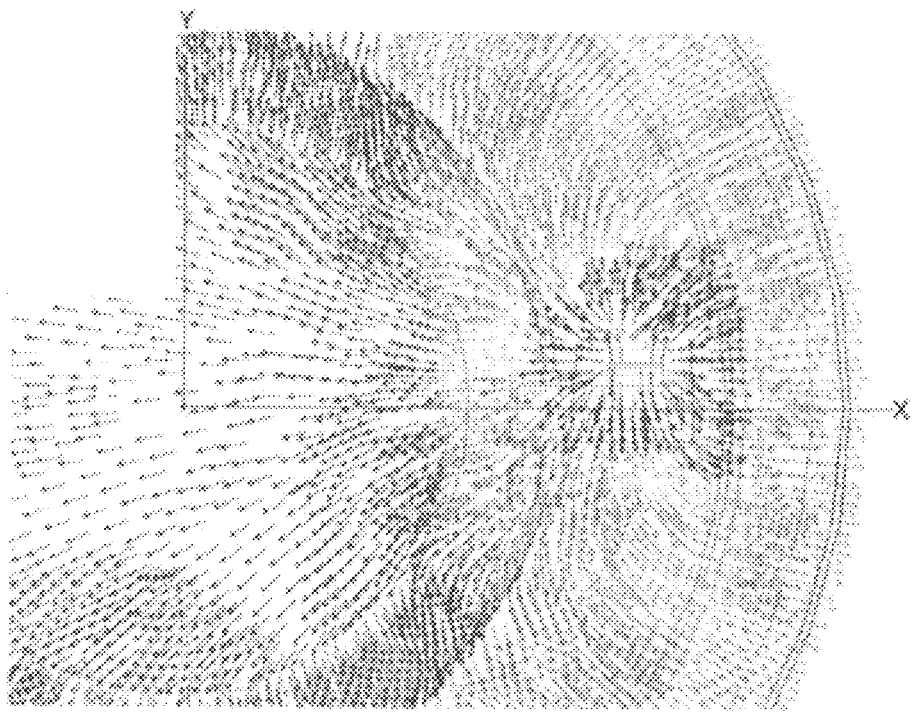
Figure 7D:
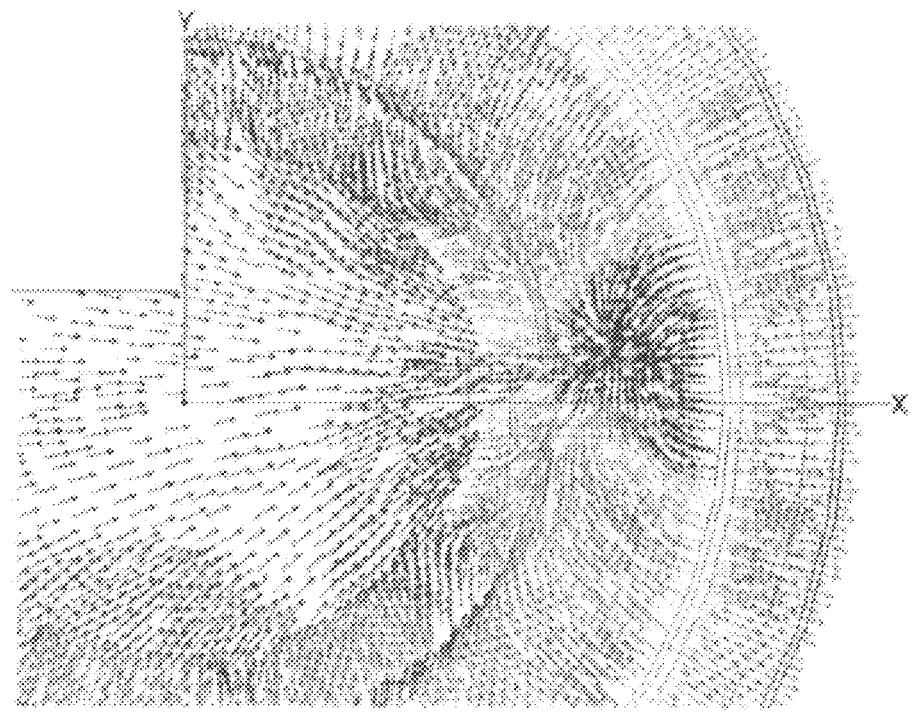

Further, FIGS. 7A to 7D show schematic views illustrating another example of effects of the substrate processing apparatus of the present embodiment. FIG. 7A shows a simulation result of electric field vector directions in the substrate processing apparatus, when an output power of +2 kW is supplied from the high frequency power supply 68 in the example shown in FIG. 6C. In addition, FIG. 7B shows a simulation result of electric field vector directions in the substrate processing apparatus, when an output power of −2 kW is supplied from the high frequency power supply 68. In addition, FIG. 7C shows a simulation result of electric field vector directions in the substrate processing apparatus, when an output power of +2 kW is supplied from the high frequency power supply 68 in the example shown in FIG. 6D. In addition, FIG. 7D shows a simulation result of electric field vector directions in the substrate processing apparatus, when an output power of −2 kW is supplied from the high frequency power supply 68.

From a comparison of FIGS. 7A, 7B and 6C, it can be seen that the electric field vector directions in the vicinity of the wafer, particularly, in the peripheral portion of the wafer, do not depend on an electrode potential but are almost fixed in the substrate processing apparatus of the present embodiment. In the meantime, from a comparison of FIGS. 7C, 7D and 6D, it can be seen that the electric field vector directions in the vicinity of the wafer, particularly, in the peripheral portion of the wafer, are largely changed depending on an electrode potential in the substrate processing apparatus of the comparative embodiment. In this regard, it can be seen that the electric field strength and the electric field vector directions in the vicinity of the wafer can be controlled, even when the output power applied to the inductively coupled electrode 66 is changed due to processing conditions of the plasma processing and the like, in the substrate processing apparatus of the present embodiment.

<Second Embodiment>

Embodiments, in which it was confirmed that particle generation can be suppressed by plasma processing which uses the substrate processing apparatus of the present embodiment, will be described.

The wafer boat having 150 sheets of wafers mounted in a multistage manner was loaded in the substrate processing apparatus according to the present embodiment shown in FIGS. 1 to 3. Here, in the vertical loaded direction, dummy wafers were inserted to respective slots of approximately hexa-sectioned wafer mounting areas of the wafer boat. In addition, in later-described FIGS. 8 and 9, these dummy wafers are represented as slots a to fin order from the top side in the height direction.

In addition, by repeating a film forming process using plasma under predetermined conditions, an accumulated film thickness on the dummy wafer and the number of particles on the dummy wafer after each film forming process were investigated.

Further, the same evaluation is performed on the same substrate processing apparatus except that the ground electrode 75 is not included, as a comparative embodiment.

Figure 8:
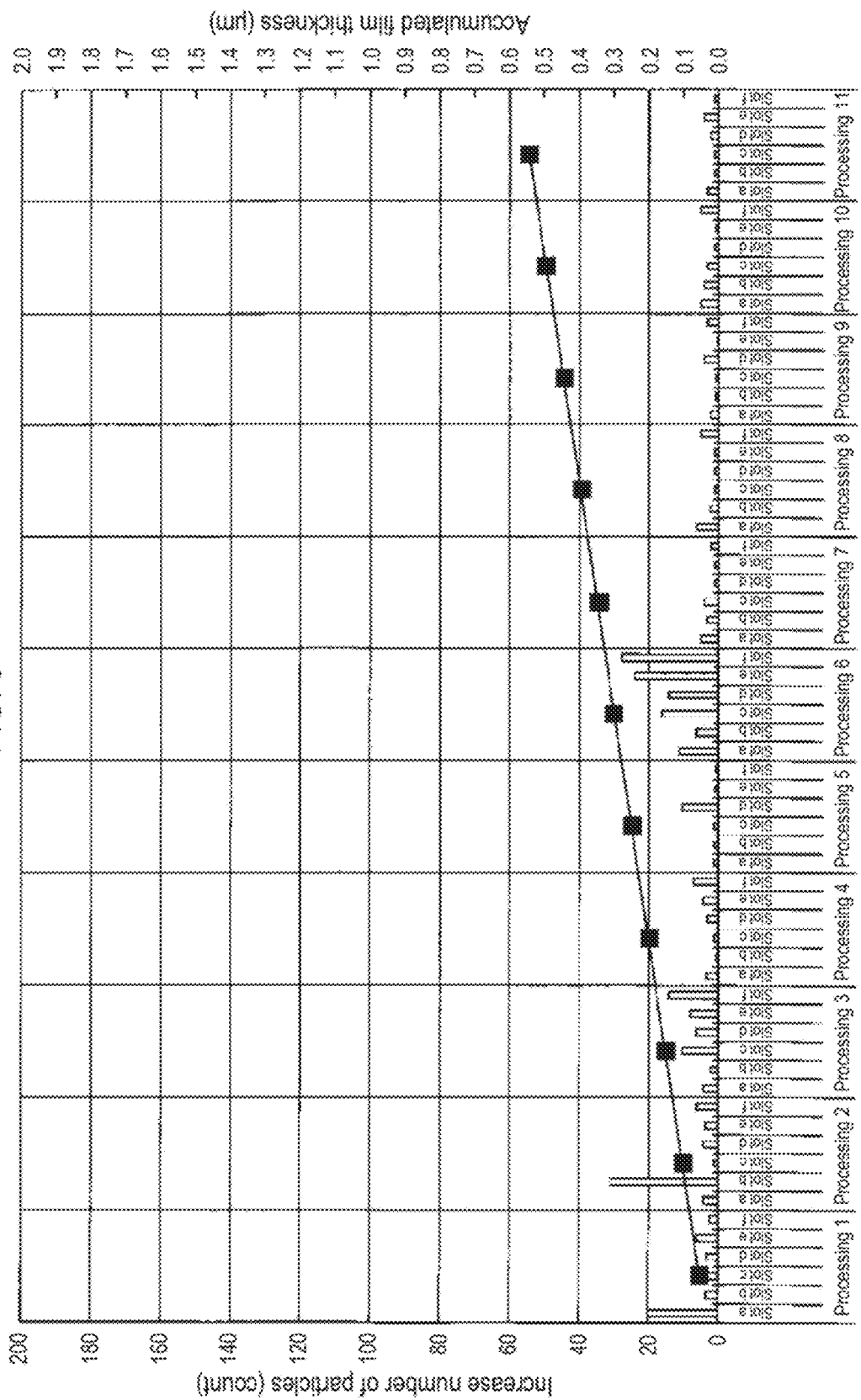
FIG. 8 is a schematic view illustrating another example of effects of the substrate processing apparatus according to the present embodiment.
Figure 9:
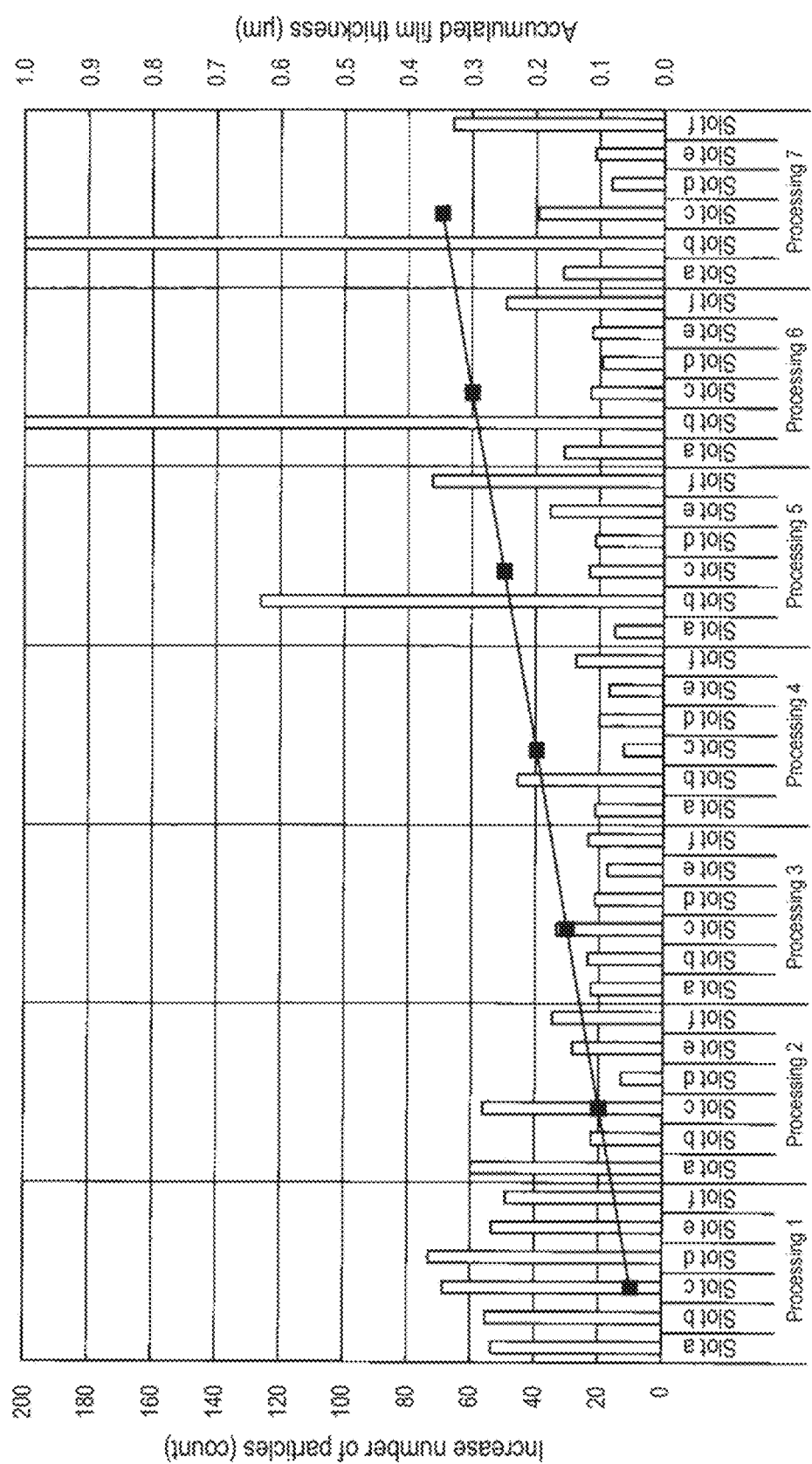
FIG. 9 is a schematic view illustrating another example of effects of the substrate processing apparatus according to the present embodiment.

FIGS. 8 and 9 show schematic views illustrating another example of effects of the substrate processing apparatus of the present embodiment. The transverse axis of FIGS. 8 and 9 represents a slot position of the dummy wafer after each plasma processing is performed. Also, the longitudinal axis represents an accumulated film thickness on the dummy wafer and the increased amount of particles on the dummy wafer for each processing. In addition, FIG. 8 shows data on the substrate processing apparatus of the present embodiment, and FIG. 9 shows data on the substrate processing apparatus of the comparative embodiment. Further, a broken line graph shows data of the accumulated film thickness, and a bar graph shows data of the increased amount of particles.

In general, a use limit of the dummy wafer is an accumulated film having a thickness of 0.5 µm or less. As shown in FIG. 8, when the substrate processing apparatus of the present embodiment is used, although the accumulated film thickness exceeds 0.5 µm in Processing 11, the number of particles does not tend to increase.

In the meantime, as shown in FIG. 9, when the substrate processing apparatus of the comparative embodiment is used, the number of particles tends to increase as the accumulated film thickness of the dummy wafer is increased. In addition, as compared with the substrate processing apparatus of the present embodiment, the number of particles is generally larger.

It can be seen from the above result that particle generation can be suppressed by using the substrate processing apparatus of the present embodiment.

A substrate processing apparatus capable of suppressing plasma generation in the vicinity of a wafer can be provided.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A substrate processing apparatus, comprising:
a processing vessel configured to be vacuumed;
a holding unit configured to hold a plurality of substrates and to be inserted into or separated from the processing vessel;
a gas supply unit configured to supply gas into the processing vessel; a plasma generation box partitioned and formed by a plasma partition wall, the plasma partition wall being located along a length direction of the processing vessel while protruding toward an outside of the processing vessel;
an inductively coupled electrode located at an outer sidewall of the plasma generation box along its length direction so as to form a space between the processing vessel and the inductively coupled electrode, the inductively coupled electrode extending from the outer sidewall of the plasma generation box toward an outside of the plasma generation box in a thickness direction of the inductively coupled electrode;
a high frequency power supply connected to the inductively coupled electrode through a feed line, the feed line extending from the inductively coupled electrode in the thickness direction of the inductively coupled electrode;
and a ground electrode located outside the plasma generation box and in the space between the processing vessel and the inductively coupled electrode so that the ground electrode is positioned outside the processing vessel when viewed from a top view, the ground electrode being arranged in the vicinity of the outer sidewall of the plasma generation box or at least partially in contact with the outer sidewall, the ground electrode extending from the outer sidewall of the plasma generation box toward the outside of the plasma generation box in the thickness direction of the inductively coupled electrode,
wherein a length of the ground electrode in the thickness direction of the inductively coupled electrode from the outer sidewall of the plasma generation box is equal to or larger than a combined length of the inductively coupled electrode and the feed line in the thickness direction of the inductively coupled electrode from the outer sidewall of the plasma generation box; and
wherein a length of the ground electrode in the length direction of the plasma generation box is equal to or larger than a length of the inductively coupled electrode in the length direction of the plasma generation box.

2. The substrate processing apparatus of claim 1, wherein the ground electrode is formed of a material including nickel alloy.

3. The substrate processing apparatus of claim 1, wherein the plasma partition wall has a lying U-shaped cross section configured by a pair of opposite lateral side walls and a back side wall connecting one side end of the pair of lateral side walls, a V-shaped cross section configured by a pair of lateral side walls having one side end connected to each other, or a curved line-shaped cross section.

4. The substrate processing apparatus of claim 1, wherein the plasma generation box includes a plurality of plasma generation boxes;
the inductively coupled electrode includes a plurality of inductively coupled electrodes;
the plurality of inductively coupled electrodes are respectively located where the plurality of plasma generation boxes are located, the plurality of the inductively coupled electrodes are connected to each other through the feed line, and the ground electrode is located outside the plasma generation box and between the processing vessel and the inductively coupled electrode, the ground electrode being at least partially in contact with the outer sidewall of the plasma generation box and extending toward the outside of the plasma generation box, and the ground electrode being located between the processing vessel and the feed line to which the plurality of inductively coupled electrodes are connected.

5. The substrate processing apparatus of claim 1, wherein the gas supply unit has a gas nozzle, the gas nozzle being located in the plasma generation box.

6. The substrate processing apparatus of claim 1, further comprising a heating unit configured to heat the substrates, the heating unit being located in an outer periphery of the processing vessel.

* * * * *